United States Patent
Czaplewski et al.

(10) Patent No.: US 10,045,437 B2
(45) Date of Patent: Aug. 7, 2018

(54) MITIGATION OF WARPING OF ELECTRONIC COMPONENTS

(71) Applicant: International Business Machines Corporation, Armonk, NY (US)

(72) Inventors: Sarah K. Czaplewski, Rochester, MN (US); Joseph Kuczynski, North Port, FL (US); Kevin M. O'Connell, Rochester, MN (US); Chelsie M. Peterson, Dexter, MN (US); Mark D. Plucinski, Toms River, NJ (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/346,309

(22) Filed: Nov. 8, 2016

(65) Prior Publication Data

US 2018/0132345 A1  May 10, 2018

(51) Int. Cl.
*B32B 3/00* (2006.01)
*H05K 1/02* (2006.01)
*H05K 1/18* (2006.01)
*H05K 3/40* (2006.01)

(52) U.S. Cl.
CPC .......... *H05K 1/0271* (2013.01); *H05K 1/181* (2013.01); *H05K 3/4007* (2013.01); *H05K 2201/068* (2013.01); *H05K 2203/043* (2013.01)

(58) Field of Classification Search
CPC ...... H05K 1/027; H05K 1/181; H05K 3/4007; H05K 2201/068; H05K 2203/043
See application file for complete search history.

(56) References Cited

U.S. PATENT DOCUMENTS

| | | | |
|---|---|---|---|
| 4,550,959 | A | 11/1985 | Grabbe et al. |
| 5,123,849 | A | 7/1992 | Deak et al. |
| 6,527,597 | B1 | 3/2003 | Harper, Jr. |
| 6,830,462 | B1 | 12/2004 | Harper, Jr. |
| 7,472,477 | B2 | 1/2009 | Beaman et al. |
| 7,632,127 | B2 | 12/2009 | Beaman et al. |
| 7,849,592 | B2 | 12/2010 | Bordsky et al. |
| 8,424,201 | B2 | 4/2013 | Domitrovits et al. |
| 2008/0141530 | A1 | 7/2008 | Beaman et al. |
| 2010/0269334 | A1 | 10/2010 | Domitrovits et al. |
| 2012/0043116 | A1* | 2/2012 | Kim ................ H01L 23/49816 174/254 |

FOREIGN PATENT DOCUMENTS

JP    S63114198    5/1988
KR    1020010050995    6/2001

* cited by examiner

*Primary Examiner* — Elizabeth E Mulvaney
(74) *Attorney, Agent, or Firm* — Lieberman & Brandsdorfer, LLC

(57) ABSTRACT

Embodiments of the disclosure relate to an apparatus and method for mitigation of warping of assembly components when subject to a thermal event. An interface unit with a complementary coefficient of thermal expansion is embodied in the assembly. The interface unit is configured to be received by a connector joined to the assembly substrate. The interface unit has a coefficient of thermal expansion (CTE) that complements the CTE of the assembly components in order to maintain the connector in alignment with the substrate and enable the connector to expand or contract with the substrate when subject to the thermal event.

20 Claims, 3 Drawing Sheets

MITIGATION OF WARPING OF ELECTRONIC COMPONENTS

BACKGROUND

The present disclosure relates generally to an apparatus for mitigation of warping of one or more electronic components. More specifically, the embodiments of the disclosure relate to an interface unit with a coefficient of thermal expansion complementary to the electronic component(s).

Decreasing packaged circuit board size, decreasing packaging costs, and increasing component-packaging (i.e. connectors) density are ongoing goals of the computer industry. A problem exists, however, with varying coefficients of thermal expansion (CTE) between connectors and printed circuit boards (PCBs), which effectively creates high stresses on associated solder interfaces. It is understood that during a solder re-flow process, both the PCB and connector are heated. At or near the conclusion of the solder re-flow process, the PCB is subject to cooling, and the solder solidifies.

During the cooling phase of the solder re-flow process, a mismatch between the CTE of the board and connector creates stress(es) in the solder joints, which may cause fracture of the solder connection. Further, the CTE mismatch can cause warpage of either or both the connector and the PCB, which in one embodiment could lead to reliability problems and low manufacturing yields. Additionally, the CTE mismatch may cause warping of the connector that lifts the connector contacts, which may result in missing or insufficient solder connection. Further, if the connector remains warped, a plugging issue may occur since the plug will not seat fully into the connector. Accordingly, the CTE mismatch effects the mechanical and/or electrical properties of the component packaging.

SUMMARY

The disclosed embodiments pertain to mitigation of warping during a thermal event utilizing an interface unit with a complementary coefficient of thermal expansion.

In one aspect, an apparatus is provided with a body configured to communicate with a substrate. Both the body and the substrate have a coefficient of thermal expansion (CTE) that is inherently associated with their material or material composition. The body is configured from at least first and second components which are placed in communication with an interface. Both the first and second components of the body are each comprised of a first material, which has a first CTE. Similarly, the substrate has a third CTE and the interface is comprised of a second material having a second CTE. The interface material is selected so that the second CTE complements the third CTE.

In another aspect, a method for mitigation of warping is provided. An assembly is formed by affixing a connector body to a provided substrate having a third CTE. Both the connector body and the substrate have a CTE that is inherently associated with their material or material composition. The assembly is configured with a first connector body positioned adjacent to a second connector body. Both the first and second connector bodies are each comprised of a first material with a first CTE. An opening having a first size is formed between the first and second connector bodies. An interface comprised of a second material with a second CTE is positioned between the first and second connector bodies. The interface material is selected so that when, the assembly is exposed to a solder re-flow process, the interface maintains the alignment of the first and second bodies.

In yet another aspect an assembly prepared by a process is provided. An assembly is formed by affixing a connector body to a provided substrate having a third CTE. Both the connector body and the substrate have a CTE that is inherently associated with their material or material composition. The assembly is configured with a first connector body positioned adjacent to a second connector body. Both first and second connector bodies are each comprised of a first material with a first CTE. An opening having a first size is formed between the first and second connector bodies. An interface comprised of a second material with a second CTE is positioned between the first and second connector bodies. The interface material is selected so that when, the assembly is exposed to a solder re-flow process, the interface maintains the alignment of the first and second bodies.

These and other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments, and not of all embodiments, unless otherwise explicitly indicated.

DETAILED DESCRIPTION

Figure 1:
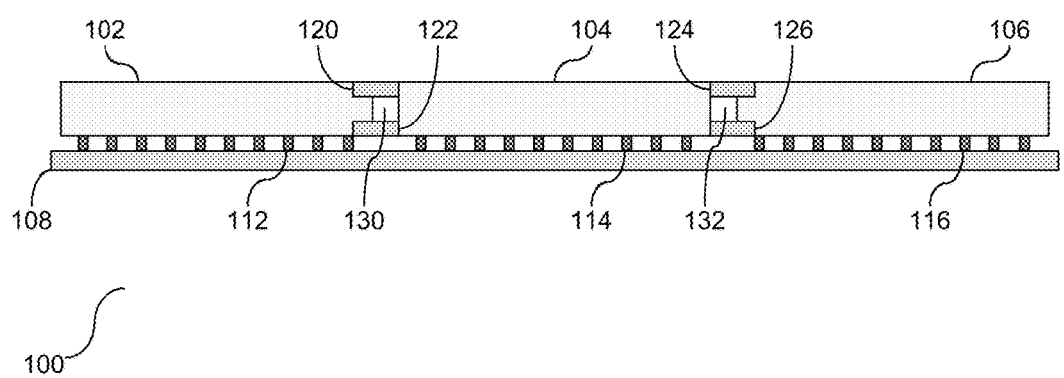
FIG. 1 depicts a diagram illustrating a side view of an embodiment of an assembly with an interface unit prior to exposure to a thermal event.

It will be readily understood that the components of the present embodiments, as generally described and illustrated in the Figures herein, may be arranged and designed in a wide variety of different configurations. Thus, the following detailed description of the embodiments of the apparatus, system, and method of the present embodiments, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment of the present embodiments. Thus, appearances of the phrases "a select embodiment," "in one embodiment," or "in an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

A wide range of connectors and components are configured to be connected to a substrate, such as a printed circuit board (PCB). Each of these elements, including the substrate, connector(s), and component(s) has a CTE that is inherently related to their associated material, or associated composition of materials. It is understood that the CTE may vary based on use of different material compositions. It is understood that a solder re-flow process subjects the elements to a re-heating and subsequent cooling process, and a by-product of the solder re-flow process may include warping. An interface unit is configured and integrated into the components to reduce any such warping. Similar to the substrate, connector(s), and component(s), the interface has a CTE that is inherent to the material composition of the interface. Accordingly, the interface is selected or configured with a CTE that complements the CTE of the substrate to enable a body, including the interface and the connector, to expand or contract at a similar rate as the substrate in order to counteract the effects of solder joint stress and assembly warp during heating and cooling.

During solder re-flow, a conductive material is placed on a substrate at one or more designated locations on the substrate (i.e. electrical interface pattern) to which the contacts of the component are to attach to the substrate. The component is placed in communication with, e.g. onto, the substrate with conductive material residing between component contacts and the electrical interface pattern of the substrate. An assembly of the substrate and component is subject to a heating process where the assembly encounters a profile of a rising or increased temperature, that in one embodiment reaches a peak temperature above the solder re-flow temperature (i.e. liquidus temperature). At the peak temperature, the conductive material is subject to a softening, or in one embodiment, melting, and an electrical connection between the component and the electrical interface pattern may be established. The process is concluded with a cool down period where the conductive material solidifies (i.e. below the liquidus temperature). The conductive material may be, but is not limited to, leaded solder, lead free solder, solder paste and conductive adhesives. In one embodiment, the conductive material is solder composed of 63% tin and 37% lead and has a re-flow temperature of 183 degrees Celsius.

A connector(s) and/or a component(s) may be joined to a substrate by use of a connection process, such as the process described above. It is understood that a byproduct of the process may be warping of the substrate, connector or component, which may affect the connection(s), and/or configuration of the substrate, connector or component. Referring to FIG. 1, a diagram (100) is provided illustrating a side view of an embodiment of an assembly with an interface unit prior to exposure to a thermal event, such as a solder re-flow process. As shown, three connector bodies (102), (104), and (106) are shown positioned in communication with a substrate (108). Although only three connector bodies are shown herein, this quantity should not be considered limiting. Connector body (104) is shown positioned between and adjacent to both connector body (102) and connector body (106). Each connector body is configured with a plurality of contacts. Specifically, connector body (102) is shown with contacts (112), connector body (104) is shown with contacts (114), and connector body (106) is shown with contacts (116). The contacts (112)-(116) are configured to communicate with and aligned with respect to an electrical interface pattern on the substrate (108). Accordingly, the contacts of each connector body are initially aligned with the substrate.

At such time as the components are positioned for assembly, e.g. prior to the solder re-flow process, an opening (130) is shown positioned or formed between connector body (102) and connector body (104). The opening (130) is shown having an initial size, and is configured to enable expansion and contraction of the connector bodies (104) and (102) during a thermal event (i.e. heating and cooling). In one embodiment, an opening (132) having an initial size is formed between the connector bodies (104) and (106). Similar to opening (130), opening (132) is configured to enable expansion and contraction of the connector bodies (104) and (106) during a thermal event. The initial size of each respective opening (130) and (132) may be the same size or different sizes. Accordingly, the connector bodies are configured with an opening positioned between adjacently positioned connector bodies, with the opening sized to enable expansion and contraction of the connector bodies.

Connector bodies (102)-(106) each have a respective size, e.g. initial length, width and depth. Each connector body has a coefficient of thermal expansion (CTE) that is inherently related to the material composition of the respective connector body, referred to herein as a first CTE. In one embodiment, each connector body (102)-(106) is comprised of the same material, and as such each connector body has the same CTE. It is understood that the substrate is comprised of a material or material composition that is different from the connector bodies (102)-(106), and as such has a different CTE, referred to herein as a third CTE. In one embodiment, the third CTE and the first CTE are different. Similarly, the substrate (108) has an initial size, e.g. length, width, and depth, during component assembly. The substrate (108) may be, but is not limited to, a PCB, an interposer, a motherboard, and a similar device. The connector bodies or substrate may warp as each connector body or the substrate expands or contracts at different rates during heating or cooling. Accordingly, the contacts of the connector bodies may become misaligned with or separated from the electrical interface pattern due to expansion contraction or warping of a connector body or the substrate.

In order to mitigate warpage, contact misalignment, and/or separation of the contact from the substrate from solder joint stress that may be caused by heating and/or cooling, an interface unit is provided between adjacently positioned connector bodies. In one embodiment, as shown, four interface units (120), (122), (124), and (126) are provided in communication with the connector bodies. Each interface unit has a second CTE inherently related to the material composition of the interface unit. In one embodiment, the first CTE, second CTE and third CTE are different. The material composition of the interface units (120)-(126) is selected so that the second CTE complements the third CTE thereby maintaining alignment of the connector bodies (102)-(106) and enabling the connector bodies (102)-(106) to move relative to each other with expansion or contraction of the substrate during a thermal event.

As shown, interface units (120) and (122) interface with connector body (102) and the connector body (104). Similarly, interface units (124) and (126) interface with connector body (104) and the connector body (106). Each interface unit has a second CTE selected to complement the expansion or contraction of the substrate and mitigate warpage, misalignment, and separation of the connector or substrate caused by a mismatch between the first CTE and third CTE. Accordingly, each interface unit mechanically joins two adjacently positioned bodies.

A thermal event relates to a heating or cooling of a select environment. When the connector bodies (102)-(106), substrate (108), and interface units (120)-(126) undergo a thermal event, their respective sizes are subject to change. For example, if the thermal event is a heating, the measurement, e.g. length, of the respective connector body may be subject to an increase so that the final measurement is greater than the initial measurement. In one embodiment, if the thermal event is a cooling, the change in measurement may be a decrease so that the final measurement is smaller than the initial measurement. It is understood that the difference between the final measurement and the initial measurement corresponds to the respective CTE of each connector body (102)-(106), substrate (108) or interface unit (120)-(126), as well as the properties of the thermal event, e.g. heating or cooling.

As shown in FIG. 1, an opening is provided between adjacently positioned connector bodies. Specifically, opening (130) is provided between connector body (102) and (104), and opening (132) is provided between connector body (104) and (106). The size of the openings (130) and (132) may be subject to change in response to exposure to a thermal event. In one embodiment, a thermal event in the form of heating causes the size of each respective opening (130) and (132) to decrease from their initial size. Conversely, if the thermal event is a cooling, the size of each respective opening (130) and (132) is subject to an increase from their initial size. The size of the openings (130) and (132) is directly related to the expansion and contraction of the connector bodies and the substrate. Accordingly, the difference in expansion and contraction between the connector bodies and substrate is mitigated by the expansion and contraction of the interface units.

In one embodiment, a conductive material is provided on top of the electrical interface pattern of the substrate (108) and configured to communicate with the contacts (112)-(116). In one embodiment, the conductive material is solder paste screened onto the electrical interface pattern. After application of the conductive material, the assembly of FIG. 1 is subjected to a solder re-flow process, referring to FIG. 2, a diagram (200) is provided illustrating compensation provided by the interface units in association with the thermal event of the solder re-flow process. As shown, during the heating process the second CTE of the interface units (220)-(226) compensates for the mismatch in CTE between the connector bodies (202)-(206) and the substrate (208). This compensation mitigates stress on the communication between the contacts and the electrical interface pattern, e.g. mitigates stress on the solder joints, and enables the contacts (212)-(216) to maintain alignment with respect to the electrical interface pattern on the substrate (208). The compensation maintains alignment even though the respective lengths of the connector bodies (202)-(206), the substrate and the interface units (220)-(226) have changed at varying amounts with respect to FIG. 1. Additionally, as shown, the openings (230) and (232) are smaller than the openings (130) and (132) in FIG. 1 as a result of the thermal event, e.g. heating. Accordingly, when subject to a heating, the interface units function to maintain communication between the respective bodies and the substrate by employing the space provided by the respective openings.

It is understood that the thermal event in the form of heating may be a limited event, and at a later point in time, the assembly is subject to a cooling. More specifically, the thermal cooling below the solder melting point enables a solid connection to be formed between the electrical interface pattern of the substrate (208) and the contacts (212)-(216). After cooling to room temperature, minimal stress is imparted to the connection formed between the electrical interface pattern and the contacts (212)-(216) since the interface units (220)-(226) mitigate differences in expansion and contraction between the connector bodies (202)-(206) and the substrate (208) due to the complementary CTE of the interface units (220)-(226). Accordingly, warping and stress between the connector bodies and the substrate is mitigated by the complementary CTE of the interface units.

Figure 2:
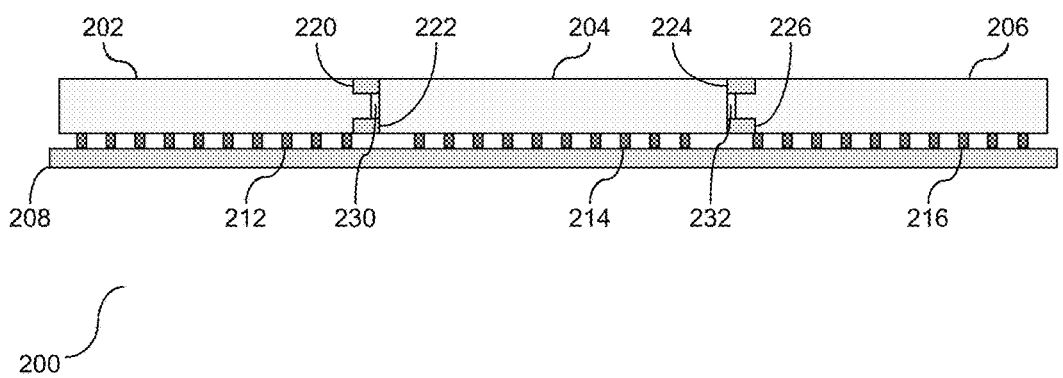
FIG. 2 depicts a diagram illustrating compensation provided by the interface unit.
Figure 3:
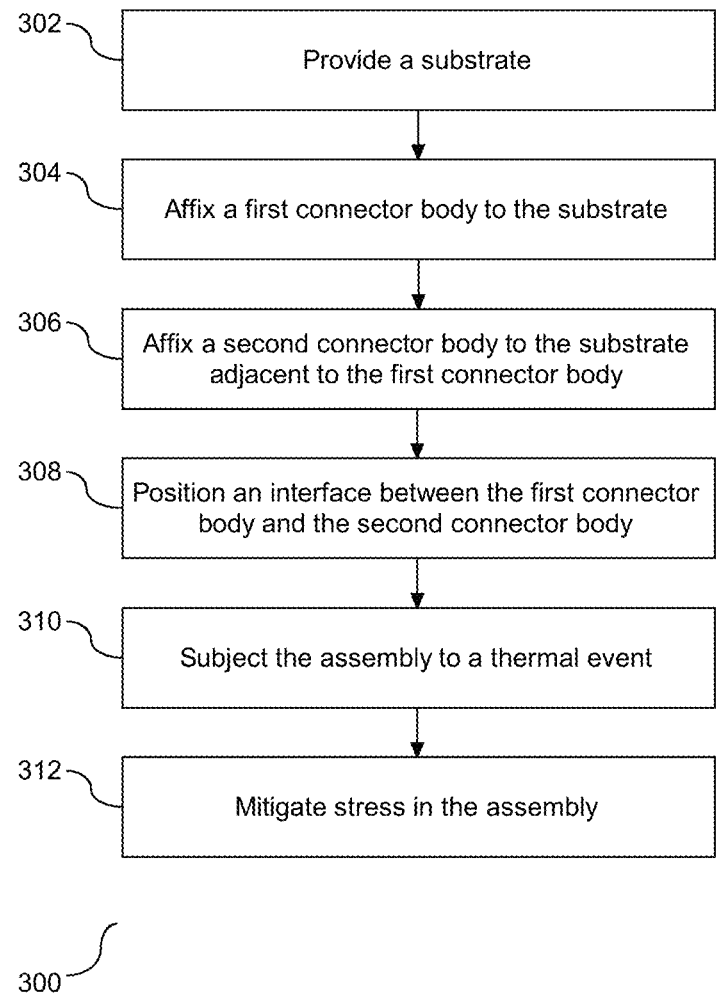
FIG. 3 depicts a flow chart illustrating a process for mitigating misalignment and stress of one or more components.

The selection of the material composition for any interface unit (120)-(126), shown in FIG. 1, and (220)-(226) shown in FIG. 2, is directed towards a material composition with a CTE that complements the CTE of the substrate in order to keep the connector or component in alignment with respect to the substrate and mitigates warping of the assembly during a thermal event. Referring to FIG. 3, a flow chart (300) is provided illustrating a process for mitigation of misalignment and stress in one or more components. As shown, a substrate is provided and configured to form an assembly (302). The substrate is comprised of a third material, or material composition, and an associated third CTE, with the third CTE related to material composition of the substrate. A first connector body is affixed to the substrate (304) and a second connector body is affixed to the substrate adjacent to the first connector body (306). Both the first connector body and the second connector body are comprised of a first material having a first CTE, with the first CTE related to the material composition of each respective connector body. In one embodiment, the first and second connector bodies are each comprised of different materials, with each material having a respective CTE. For example, in one embodiment, the second connector body is comprised of a fourth material having a fourth CTE different from the first CTE of the first connector body. Accordingly, the assembly includes connector bodies affixed to a substrate, with the bodies and the substrate having different CTEs.

As a result of affixing the connector bodies to the substrate, the first connector body and second connector body are positioned with an opening formed between the first connector body and the second connector body. An interface is positioned between the first connector body and the second connector body (308), and in one embodiment integrated into one or both of the connector bodies. In one embodiment, the interface is positioned between the first and second connector body wherein the first and second connector bodies are mechanically joined before affixing the first and second connector bodies to the substrate. In one embodiment, the interface extends across the formed opening. The material composition of the interface is chosen so that the CTE of the interface, referred to herein as the second CTE, complements the CTE of the substrate, referred to herein as the third CTE, thereby mitigating misalignment, stress on solder joints and warpage of the connector bodies and the substrate when subject to a thermal event. In one embodiment, the CTE of the interface complements the CTE of the connector housing with respect to the CTE of the substrate. Accordingly, the interface mitigates misalignment, stress and warpage of the connector bodies and the substrate.

As shown, the assembly is subjected to a thermal event (310). During and after the thermal event, the first and second connector bodies positioned to move at a similar rate as the substrate due to the interface (312), e.g. mitigate stress in the assembly and maintain alignment of the connector bodies with respect to the substrate. More specifically, the second CTE of the interface complementing the third CTE of the substrate, together with the size of the opening between the connector bodies, enables the connector bodies and substrate to expand or contract in a similar manner. The second CTE is selected such that a mismatch between the first CTE and third CTE, which may lead to differences in expansion and/or contraction between the connector bodies and the substrate, are mitigated. Accordingly, the expansion and contraction of the connector bodies and the substrate are compatible during a thermal event by the interface having a material composition with a CTE which complements the CTE of the substrate.

Figure 4:
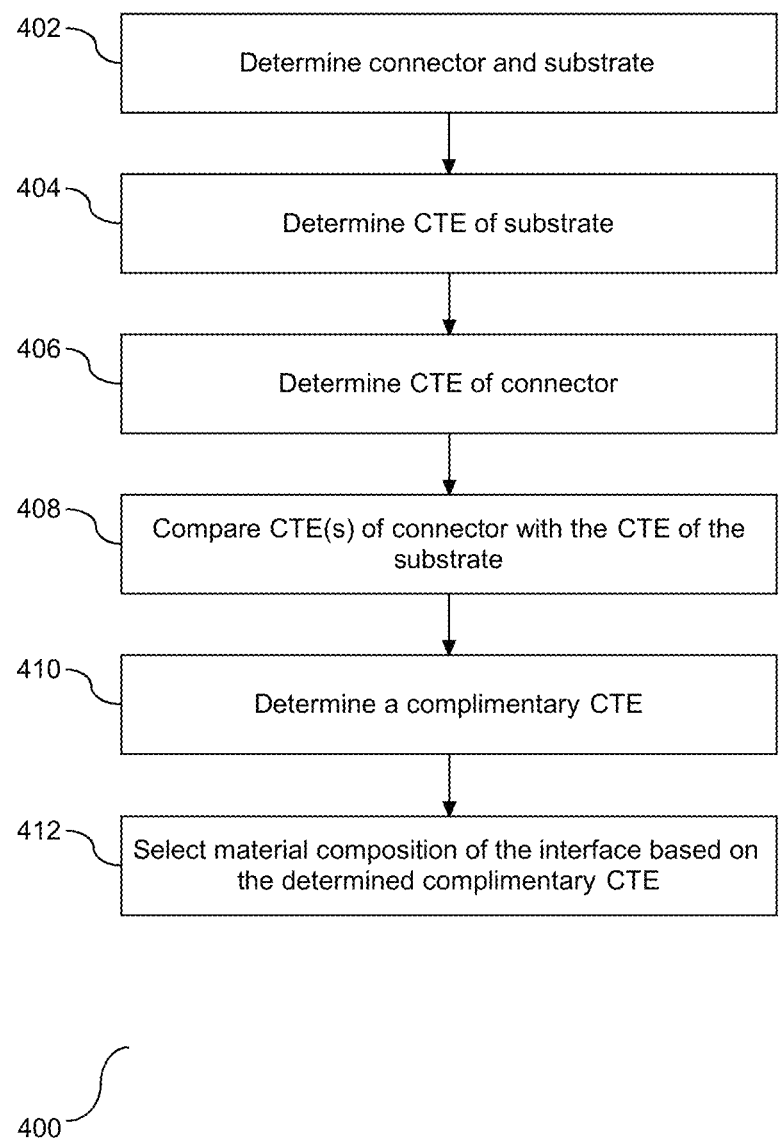
FIG. 4 depicts a flow chart illustrating a process for selecting the material composition for the interface unit.

The selection of the material composition for any interface unit (120)-(126), shown in FIG. 1, and (220)-(226) shown in FIG. 2, is based upon the CTE of both the substrate and the CTE of any component being affixed to the substrate for which the interface unit will enable compatible thermal expansion and contraction. Referring to FIG. 4, a flow chart (400) is provided illustrating a process for selection of the material composition for the interface unit. As shown, a component(s) and/or connector(s), hereinafter connector, and a substrate of which the connector will be affixed to is determined, or in one embodiment selected, (402). The CTE of the substrate or substrate composition is ascertained (404), and the CTE of the connector is also determined (404). The CTE of the connector or substrate may be determined by variety of means known in the art. Such CTE determination means may be but are not limited to, examining a data sheet, searching data storage, Michelson interferometry, optical diffraction, strain gage, and/or volumetric measurements. Accordingly, the substrate and connectors to be affixed to the substrate are identified and their corresponding CTEs are determined.

After the determination of the CTE of each element in the assembly, e.g. substrate, connectors, bodies, etc., the CTE of the connector is compared with the CTE of the substrate (408). This comparison includes determination of similarities and differences between the CTEs. Based on the comparison, a complementary CTE to the assembly elements, e.g. substrate, connectors, etc., is determined so that the expansion or contraction of the connector and interface is similar to that of substrate during a thermal event (410). In one embodiment, the determination of the complementary CTE for the interface will enable an assembly comprised of the interface and connector to expand and/or contract at a similar rate as the expansion or contraction rate of the substrate. Based on the complementary CTE, a material composition of an interface is selected (412). In other words, a material for the interface is selected so that the CTE of the interface matches the complementary CTE selected at step (412). In one embodiment, the material composition of the interface has a CTE which is the same as the complementary CTE. In one embodiment, the substrate is a PCB, the connector body is comprised of a Liquid Crystal Polymer (LCP) and the interface is comprised of polyetherimide (PEI). Accordingly, the material of the interface is selected in order to match the expansion or contraction of the connector and interface with respect to the substrate prior to, during, and after a thermal event.

A wide range of connectors may be connected to the substrate such as, but not limited to, Through Hole Mounted (THM) and Surface Mounted Technology (SMT) connectors. A wide range of components may be connected to the substrate such as, but not limited to, a dual inline memory module (DIMM) socket, accelerated graphics port (AGP) socket and peripheral component interconnect (PCI) sockets. The connectors may be composed of, but is not limited to, liquid crystal polymer (LCP), Polyphenylene Sulfides (PPS), Polycyclohexylene Terephthalates (PCT), Polybutylene Terephthalate (PBT), Polyethylene Terephythalate (PET), and/or Polyetherimide (PEI), Nylon.

In one embodiment, the interface is made of a polymer material, such as a plastic. In one embodiment, the interface is comprised of a memory polymer in order to offset the expansion or contraction of the substrate. The interface comprised of a memory polymer will compress or decompress in order to absorb differences between the expansion/contraction rates of the substrate and the connector body. In one embodiment, the interface unit is molded into the connector body via insert molding.

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed.

It will be appreciated that, although specific embodiments have been described herein for purposes of illustration, various modifications may be made without departing from the sprit and scope of the embodiments. Accordingly, the scope of protection of these embodiments is limited only by the following claims and their equivalents.

The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles of the embodiments and the practical application, and to enable others of ordinary skill in the art to understand the embodiments for various embodiments with various modifications as are suited to the particular use contemplated. Accordingly, the implementation of an interface unit with a complementary coefficient of thermal expansion can provide mitigation of component warping.

It will be appreciated that, although specific embodiments have been described herein for purposes of illustration, various modifications may be made without departing from the spirit and scope of the embodiments. In particular, any number of components may be installed in communication with the substrate. In one embodiment, a connector or component may be installed on multiple substrates. Accordingly, the scope of protection of the embodiments is limited only by the following claims and their equivalents.

What is claimed is:

1. An assembly comprising:
a body in communication with a substrate, the body comprising a first component and a second component;
an interface positioned between the first and second components;
the body comprised of a first material with a first coefficient of thermal expansion (CTE);

the interface comprised of a second material with a second CTE; and the substrate having a third CTE, wherein the second CTE complements the third CTE.

2. The assembly of claim 1, further comprising in a first position, an opening formed between the first and second component, the opening having a first size.

3. The assembly of claim 2, further comprising the first and second components in a second position after exposure of the assembly to a solder re-flow process.

4. The assembly of claim 3, further comprising, in the second position, the opening formed between the first and second components having a second size, different than the first size, wherein the second size is selected from the group consisting of: smaller than the first size and larger than the first size.

5. The assembly of claim 3, further comprising the first and second components subject to a change from the solder re-flow process, the change selected from the group consisting of: expansion and contraction, and the interface to maintain alignment of the first and second bodies.

6. The assembly of claim 1, wherein the interface is configured to limit a condition of the first connector body, the condition selected form the group consisting of: stress and warp.

7. The assembly of claim 1, wherein the interface enables movement of the first and second component with the substrate during a thermal event.

8. A method comprising:
providing a substrate with a third coefficient of thermal expansion (CTE);
forming an assembly, including:
affixing a connector body to the substrate including a first connector body positioned adjacent to a second connector body, the first and second bodies comprised of a first material with a first CTE;
an interface positioned between the first body and the second body, the interface comprised of a second material with a second CTE; and
a first opening formed between the interface and the first body and a second opening formed between the interface and the second body;
exposing the assembly to a solder re-flow process; and
the interface maintaining alignment of the first and second bodies during the solder re-flow process.

9. The method of claim 8, wherein the solder re-flow process transforms the interface, including changing at least one of the first and second openings from the first size to a second size, wherein the second size is selected from the group consisting of: smaller than the first size and larger than the first size.

10. The method of claim 8, further comprising limiting, by the interface, a condition of the first connector body, the condition selected from the group consisting of: stress and warp.

11. The method of claim 8, wherein the interface maintaining alignment of the first and second bodies includes movement of the first and second bodies with the substrate during the solder re-flow process.

12. An assembly, prepared by a process comprising the steps of:
providing a substrate with a third coefficient of thermal expansion (CTE);
forming an assembly, including:
affixing a connector body to the substrate including a first connector body positioned adjacent to a second connector body, the first and second bodies comprised of a first material with a first CTE;
affixing an interface between the first body and the second body, the interface comprised of a second material with a second CTE; and
forming a first opening between the interface and the first body and a second opening between the interface and the second body;
exposing the assembly to a solder re-flow process; and
the interface maintaining alignment of the first and second bodies.

13. The assembly of claim 12, wherein the solder re-flow process transforms the interface and changes at least one of the first and second openings from the first size to a second size, wherein the second size is selected from the group consisting of: smaller than the first size and larger than the first size.

14. The assembly of claim 13, wherein the solder re-flow process expands the substrate from a first length to a second length.

15. The assembly of claim 14, wherein the transformation of the interface is in coordination with the expansion of the substrate.

16. The assembly of claim 12, further comprising:
limiting a condition of the first connector body, the condition selected from the group consisting of: stress and warp.

17. The assembly of claim 12, wherein the interface maintaining alignment of the first and second bodies includes enabling movement of the first and second bodies with the substrate during a thermal event.

18. The assembly of claim 1, further comprising a first opening positioned between the first component and the interface and a second opening positioned between the second component and the interface.

19. The assembly of claim 1, wherein the first component and the second component are adjacently positioned.

20. The assembly of claim 1, wherein the interface is comprises a memory polymer material.

* * * * *